United States Patent [19]

Chu et al.

[11] 4,206,472
[45] Jun. 3, 1980

[54] THIN FILM STRUCTURES AND METHOD FOR FABRICATING SAME

[75] Inventors: Wei-Kan Chu, La Grangeville; James K. Howard, Fishkill; James F. White, Newburgh, all of N.Y.

[73] Assignee: International Business Machines Corporation, Armonk, N.Y.

[21] Appl. No.: 864,182

[22] Filed: Dec. 27, 1977

[51] Int. Cl.$^2$ .............................................. H01L 23/48
[52] U.S. Cl. .................................. 357/67; 357/71
[58] Field of Search ................................ 357/67, 71

[56] References Cited

U.S. PATENT DOCUMENTS

| 3,878,442 | 4/1975 | Bhatt | 357/67 |
|---|---|---|---|
| 3,906,540 | 9/1975 | Hollins | 357/67 |
| 3,939,047 | 2/1976 | Tsunemitsu et al. | 357/67 |

*Primary Examiner*—Edward J. Wojciechowicz
*Attorney, Agent, or Firm*—David M. Bunnell

[57] ABSTRACT

Thin film structures comprising a layer of aluminum and a material having a tendency to interact with aluminum are separated by an intermediate layer of aluminum having a high aluminum oxide content. The intermediate layer prevents said interaction by acting as a diffusion barrier.

Preferred embodiments are directed to silicon semiconductor metallization structures, including Schottky barrier contacts, which comprise a bottom layer of tantalum, or other transition metal, or a metal silicide in contact with a silicon substrate, an intermediate layer of aluminum having a high aluminum oxide content and a top layer of aluminum. The intermediate layer functions as a diffusion barrier between aluminum and the metal, metal silicide or silicon. The preferred embodiments of the invention also includes the process for forming such structures preferably comprising: depositing pure tantalum under high vacuum in evaporation apparatus, substituting aluminum for tantalum in the evaporation apparatus and bleeding-in water, air or oxygen to form the aluminum oxide-rich intermediate aluminum layer and then returning to the high vacuum to deposit pure aluminum. The invention is also applicable to FET or CCD structures where a diffusion barrier for aluminum is required.

13 Claims, 3 Drawing Figures

4,206,472

THIN FILM STRUCTURES AND METHOD FOR FABRICATING SAME

CROSS REFERENCE TO RELATED APPLICATIONS

This application is related to the application of Dalal et al, Ser. No. 827,912, Filed Aug. 26, 1977 entitled "Tantalum Semiconductor Contacts and Method for Fabricating Same" and assigned to the same assignee as the present application.

This application is also related to the application of J. K. Howard et al, Ser. No. 755,272, Filed Dec. 29, 1976 entitled "An Improved Schottky Barrier Contact and Methods of Fabrication Thereof", and assigned to the same assignee as the present application.

BACKGROUND OF THE INVENTION

1. Field of the Invention

The present invention relates to thin film structures which include aluminum. In particular, it relates to metallurgies formed atop semiconductor substrates, such as silicon semiconductor metallization to form ohmic contacts, Schottky Barrier diode contacts and FET gate-type structures.

2. Description of the Prior Art

The requirements for a material or combination of materials to provide ohmic and Schottky barrier contacts to silicon semiconductor substrates are very stringent from both an electrical as well as a chemical standpoint.

Among the numerous metallurgical systems which are known to semiconductor designers for such contacts, the single most successful metal used in interconnections of silicon planar transistors and integrated circuits is aluminum or aluminum which is doped with a small amount of copper. However, as is well known in the art, aluminum has a tendency to interact with silicon, particularly during high temperature processing. In addition, aluminum alone forms neither a very high- nor a low barrier height Schottky barrier contact to silicon. With the usual aluminum-silicon barrier, a barrier height in the order from 0.68 to 0.72 electron volts is achievable.

This system can therefore not be used for forming a Schottky barrier diode (SBD) with a low barrier height, i.e., around 0.5 electron volts. Quite recently, circuit families such as DTL, I²L and Schottky transistor logic have been implemented which require Schottky Barrier diodes with such low barrier height characteristics. Reference is made in particular to the DTL type circuit, described in the publication by A. W. Peltier entitled "Advances in Solid-State Log.c—A New Approach to Bipolar LSI: C³L", 1975 IEEE International Solid-State Circuits Conference, Digest of Technical Papers, pages 168–169.

In addition, more sophisticated circuit designs require both a high-barrier-height Schottky barrier diode contact as well as a low-barrier-height Schottky barrier diode contact on the same semiconductor substrate. Most useful is a metallurgical system which would provide not only these types of contacts but also ohmic contacts, so that each type of contact could be fashioned concurrently during the fabrication process.

The above-referenced application of Dalal et al has solved these problems by providing a structure which comprises a bottom layer of tantalum in contact with the silicon substrate, an intermediate layer of chrome and a top layer of aluminum, the chrome being necessary to prevent the interaction of the aluminum with the tantalum or silicon substrate. Without the chrome diffusion barrier, this interaction causes the barrier height of the tantalum-silicon contact to increase, i.e., to approach that of an aluminum-silicon contact.

The Dalal et al contact structure has succeeded in providing a Schottky barrier diode of around 0.5 electron volts; it can also be used to provide a high barrier height contact when platinum silicide is formed in the silicon layer prior to the deposition of tantalum. In addition, the structure described in the above-referenced application is useful as an ohmic contact when formed on a highly-doped N type silicon surface.

The fabrication process invented by Dalal et al requires careful controls to prevent contamination of the tantalum; in particular, the formation of tantalum oxide is deleterious. Moreover, it is desirable to reduce the number of different metals required by Dalal et al to achieve a low-barrier-height Schottky barrier diode.

The above-referenced application of Howard et al utilizes an aluminum-transition metal contact structure to form very reliable Schottky barrier diodes. However, such a structure provides a low-barrier-height contact which is thermally stable of around 0.62 electron volts rather than around 0.5 ev.

Another metallurgical contact which has achieved widespread use in the industry to provide a Schottky barrier diode having a barrier height of around 0.5 electron volts is a tinanium-tungsten alloy. However, it is quite difficult to evaporate titanium-tungsten, thus limiting its application to sputtering processes. In addition, the barrier height of titanium-tungsten Schottky barrier diode tends to drift upward with increasing annealing temperatures.

Aluminum also reacts with other metals and metal silicides, sometimes beneficially and sometimes deleteriously. For example, in the above-referenced application of Howard et al. Aluminum-transition metal compounds are useful as Schottky Barrier contacts. On the other hand, aluminum will penetrate through other metals like tantalum or platinum silicide to an underlying layer such as monocrystalline silicon or polycrystalline silicon, which may cause erosion of the silicon surface.

Moreover, aluminum will interact with gold and silver, rare earth metals such as Gd, Ln, Y, Yb, Pr, etc., lead and tin solders and amorphous silicon.

SUMMARY OF THE INVENTION

It is therefore a primary object of our invention to prevent the interaction of aluminum and materials which interact with aluminum such as another metal, metal silicide or semiconductor material.

It is another object of our invention to simplify the manufacture of low-barrier-height Schottky barrier diodes.

It is a further object of our invention to include also the fabrication of high-barrier-height Schottky barrier diodes and ohmic contacts in said simplified process.

These and other objects of our invention are achieved in our preferred embodiment with a contact structure comprising a bottom layer of tantalum, or other transition metal, having a low barrier height, in contact with a silicon substrate, an intermediate layer of aluminum having a high aluminum oxide content and a top layer of aluminum. Alternatively, an intermediate layer of tantalum having a high tantalum oxide content may be disposed between said tantalum and said oxide-rich aluminum. This metallurgical system provides a Schottky barrier diode having a barrier height of around 0.5 ev which is thermally stable.

Such a contact structure is also useful both as a Schottky barrier diode contact having a high barrier height as well as a ohmic contact if a metallic silicide is formed in the silicon prior to the deposition of the tantalum or other transition metal.

The preferred novel method for forming our metallurgical system is advantageous in that it can be performed in situ in an evaporation or sputtering chamber without the removal of the semiconductor wafer during the entire deposition process.

The preferred method comprises depositing pure tantalum or other transition metal under high vacuum in evaporation apparatus, substituting aluminum for tantalum in the evaporation apparatus and bleeding-in water, air or oxygen to form the intermediate aluminum oxide layer and then returning to the high vacuum to deposit aluminum or copper-doped aluminum.

We have found that the aluminum-oxide-rich aluminum layer prevents the aluminum layer from penetrating the tantalum and then the silicon. This diffusion barrier property is the key to the stability of the barrier height of the Schottky barrier diode.

We believe that the oxygen included in the aluminum is preferentially introduced into the metallic grain boundaries. This apparently minimizes metallurgical diffusion in these regions, while allowing electrical conduction through the remaining aluminum in said aluminum-oxide-rich aluminum layer. We may be incorrect in this theory and provide it only to give those of skill in the art a better understanding of our invention.

In cases where the intermediate tantalum-oxide-rich tantalum is present, the air bleeding occurs while the tantalum is still in the evaporation chamber.

Our discovery, although most advantageously applicable to semiconductor contacts, has much broader applications. It is useful in any instance where aluminum interaction or diffusion occurs with another material. The aluminum-oxide-rich aluminum prevents such diffusion. For example, in field effect transistors or charge-coupled devices polycrystalline silicon is commonly used as the gate electrode and aluminum is disposed thereon as the interconnection metallurgy. During the deposition of the aluminum, it tends to diffuse through the silicon gate electrode. Our invention prevents this as well as the diffusion of aluminum through monocrystalline and amorphous silicon.

In addition, our invention can be used to prevent the interaction of metals such as gold and silver and rare earth metals such as Gd, Lu, Y, Yb, Pr, etc. The interaction of aluminum with metals is a particular problem at above 340° C. because aluminum is a fast diffusion species at these temperatures.

Our invention can also be used to reduce or prevent the formation of Aluminum-lead or aluminum tin eutectics which form preferentially in the aluminum grain boundaries at between 200°–300° C.

DETAILED DESCRIPTION OF THE INVENTION

Figure 1:
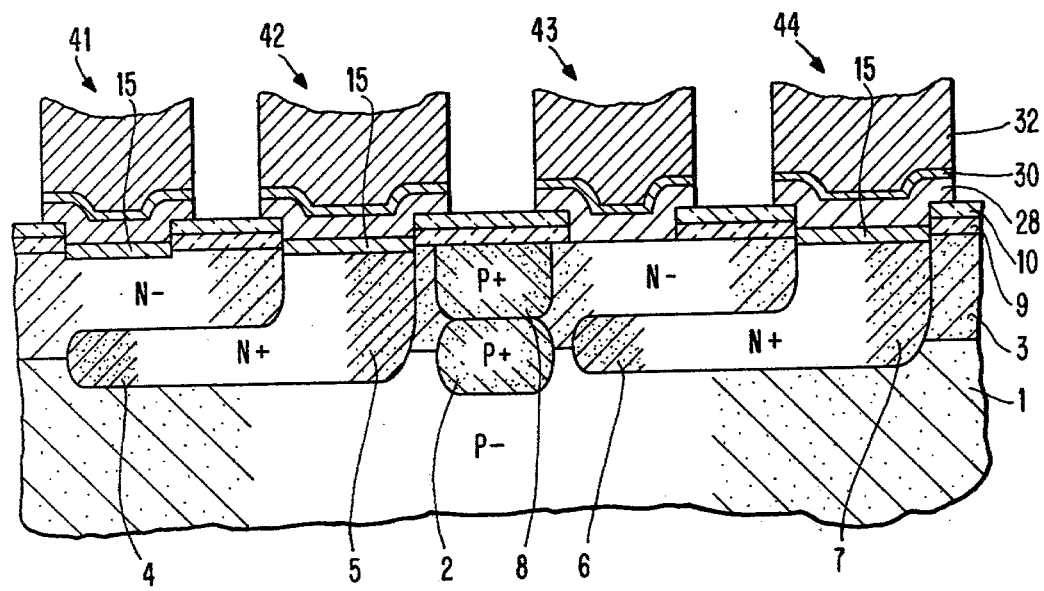
FIG. 1 is a fragmented, cross-sectional view of a semiconductor device incorporating the novel metallurgy of our invention.

FIG. 1 illustrates that portion of a semiconductor chip which contains our novel metallurgy disposed atop impurity regions of the semiconductor. It will be understood by those of skill in the art that many thousands of diodes and other semiconductor devices such as transistors, resistors, etc. will ordinarily be contained within the same chip.

Chip substrate 1 is illustrated as P- type silicon which has a typical resistivity of around 10 ohm-cm. Disposed on substrate 1 is N- layer 3 which preferably exhibits a concentration of from $1 \times 10^{16}$ to $8 \times 10^{16}$ atoms per cm$^3$. Buried within the structure are regions 4 and 6 having associated therewith reachthrough regions 5 and 7, respectively. The substrate also contains P+ isolation regions 2 and 8 for separating the N type regions.

Regions 2, 4 and 6 are advantageously formed by the usual process of diffusing said regions into windows which expose portions of the bare substrate 1. Typical N+ impurities are arsenic or phosphorus; a typical P+ impurity is boron. The masking layer is then stripped from substrate 1 by conventional etching techniques and layer 3 is grown epitaxially, thereby causing regions 2, 4 and 6 to out-diffuse into layer 3. A masking layer, which is typically a composite of silicon oxide layer 9 and silicon nitride layer 10 is deposited on the surface of layer 3. In the composite masking layer windows are then formed, through which metallurgy is deposited to make contact with various regions within epitaxial layer 3.

At contact regions 41, 42 and 44 a layer of platinum silicide 15 or other suitable metallic silicide is formed. The process for forming platinum silicide in semiconductors is by now well known to those of skill in the art. The preferred method is described in the above-referenced application by Dalal et al, Ser. No. 827,912, filed Aug. 26, 1977, which is hereby incorporated by reference in the present application. Hence no further description of the formation of layer 15 will be made in this application. It should be noted, however, that the platinum may be evaporated in the same evaporation chamber as is used to form the remainder of our novel metallurgy.

The deposition of the metallurgical system preferably includes the lift-off technique described in U.S. Pat. No. 4,004,044, which issued in the names of Franco et al and which is assigned to the same assignee as the present application. The process is also described in the copending application of Dalal et al mentioned above. Alternate techniques for defining the metallurgical pattern are standard wet or reactive ion (plasma) subtractive etching processes which are well known to those of skill in the art. However, the lift-off technique provides superior definition of the metallurgy, thereby minimizing the area required for wiring; it also provides fewer problems of contamination.

What has been described thus far is by now well known to those of skill in the semiconductor processing art and forms no part of our invention per se.

Disposed atop platinum silicide layer 15 at contact areas 41, 42 and 44 is tantalum layer 28. Alternatively, layer 28 may comprise zirconium, nickel, hafnium, titanium or other transition metals which exhibit low barrier heights. Alloys of transition metals such as 90% Ta-10% W or 80% Ta-20% Zr are also useful. Layer 28 is disposed directly atop N-layer 3 at contact region 43, so as to form a low-barrier-height Schottky barrier diode. Disposed atop layer 28 is a thin layer of aluminum-oxide-rich aluminum 30. An aluminum layer 32 is disposed atop layer 30 to complete the contact system of our invention. Contacts 41, 42, 43 and 44 form a high-barrier-height Schottky barrier diode, an ohmic contact, a low-barrier-height Schottky barrier diode and another ohmic contact, respectively. Ohmic contacts 42 and 44 function as the cathodes for their associated anodes 41 and 43, respectively.

We have found that the aluminum-oxide-rich aluminum layer 30 is an effective barrier to the penetration of tantalum layer 28 by aluminum layer 32. We believe that the oxygen in layer 30 is preferentially introduced into the aluminum grain boundaries of that layer, thereby minimizing the diffusion of aluminum 32 through layer 30 into layer 28. Nonetheless, the remaining aluminum layer 30 allows for electrical conduction, without undue series resistance, between layer 32 and the rest of the contact.

Figure 2:
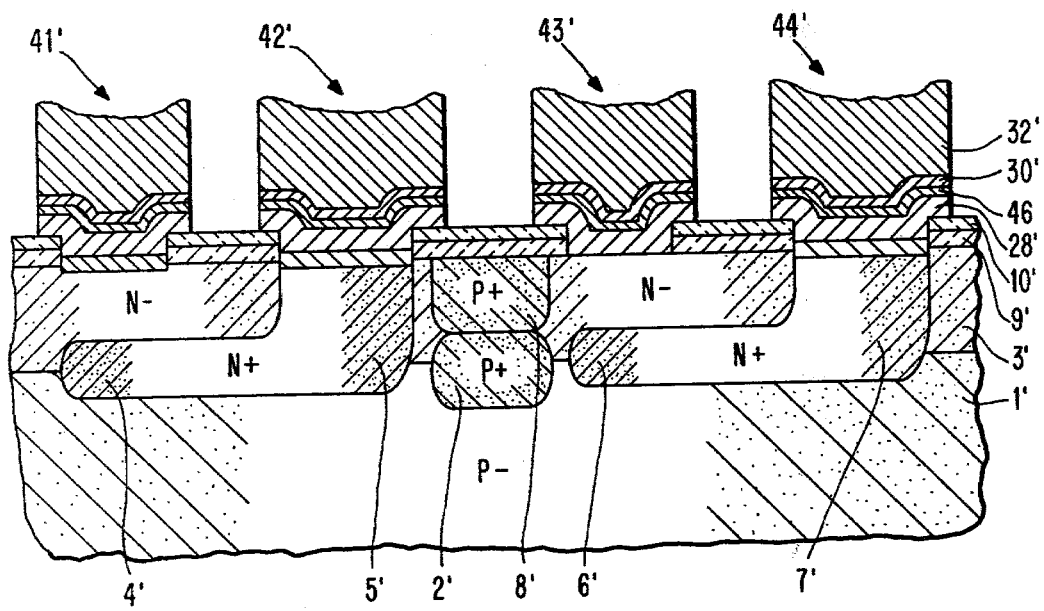
FIG. 2 is a fragmented, cross-sectional view of a semiconductor device incorporating another embodiment of our invention.

FIG. 2 is an alternate embodiment of our invention which includes the formation of a transition metal oxide, such as tantalum oxide 46. The remaining regions of the semiconductor device and the metallurgy are the same as those illustrated in FIG. 1 so that the regions in FIG. 2 which correspond to those in FIG. 1 are simply identified by the same numeral primed. Thus isolation region 2' in FIG. 2 corresponds to isolation region 2 in FIG. 1 and so forth.

Figure 3:
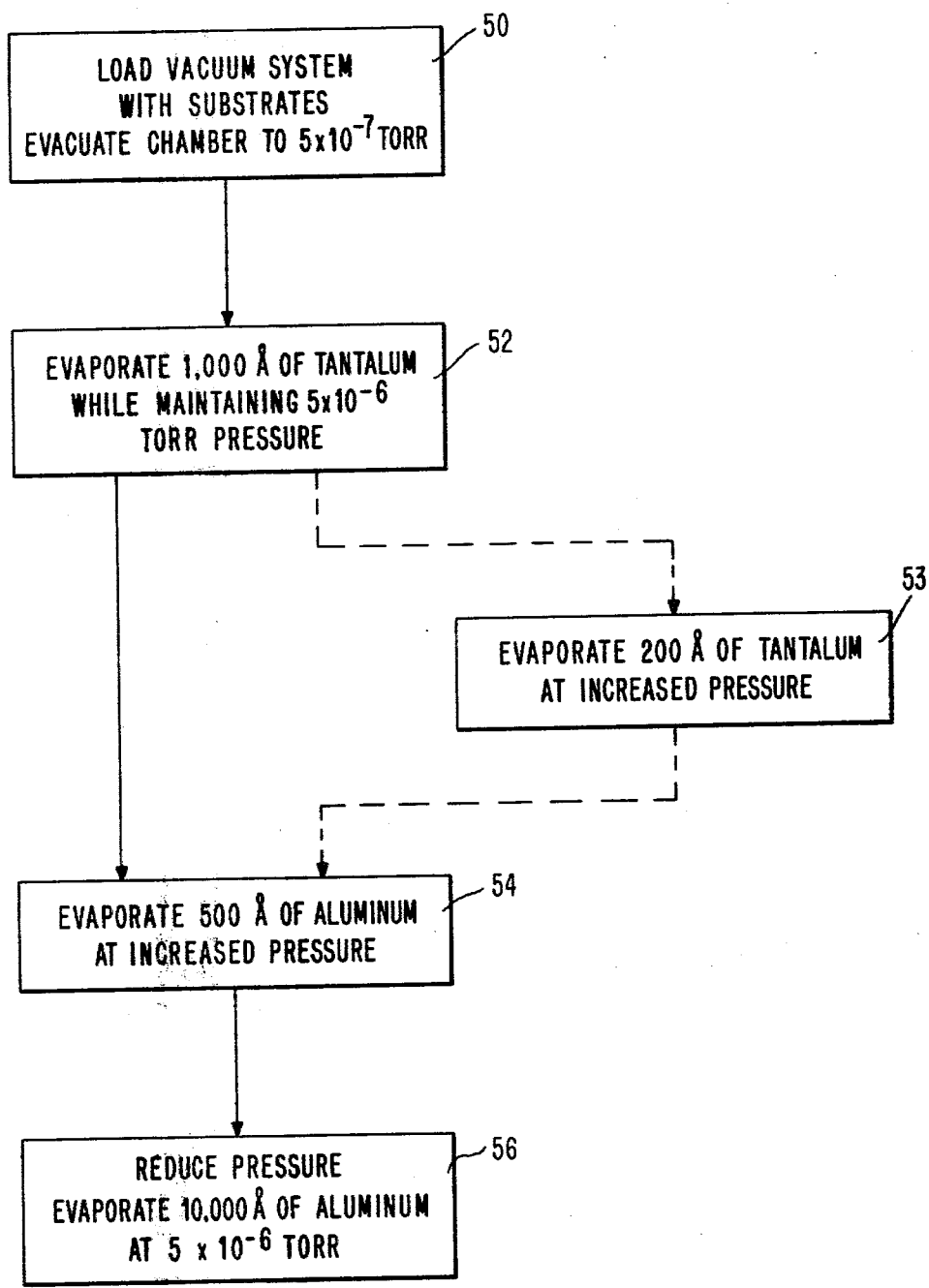
FIG. 3 is a flow diagram illustrating the preferred methods for forming the metallurgy illustrated in FIGS. 1 and 2.

The preferred process for forming our metallurgical contact system is illustrated in FIG. 3. Step 53 in FIG. 3 represents an added step for forming the metallurgical system illustrated in FIG. 2.

In the first step, enumerated as 50 in FIG. 3, the wafer substrate or substrates are loaded into a standard evaporator. The deposition of the metallurgy is best accomplished in an E-beam evaporation source such as is marketed by the Airco-Temescal Corp. as their model FC1800 system. Similar types of evaporation systems are available from other vendors. The evaporation system is evacuated for an extended period of time, with particular emphasis on outgassing the walls of the evaporator to reduce as much as possible any oxygen contamination during evaporation. The maximum pressure in the evaporation chamber after the beginning of the evaporation process is $2.5 \times 10^{-6}$ torr, with the initial pressure in the chamber being less than $4 \times 10^{-7}$ torr.

After evaporation and sintering of the platinum, which is conventional in the art and not illustrated in FIG. 3, the transition metal layer of tantalum of about 1,000 Å is evaporated onto the substrate while maintaining a pressure of around $5 \times 10^{-6}$ torr, as indicated in step 52. The tantalum is evaporated very slowly so as to produce a fairly fine-grain structure, with the preferred evaporation rate being around 20 Å per second.

After the deposition of the tantalum, the evaporation of aluminum is begun at increased pressure, i.e., with reduced vacuum as shown in step 54. By this we mean that oxygen is introduced into the evaporation chamber such as by an air-, oxygen-, or water-bleed. This increases the pressure, preferably to around $2 \times 10^{-5}$ torr, although even higher pressure may be used if a greater $Al_2O_3$ content is desired in layer 30. By this technique material 30 which actually forms atop the tantalum 28 in FIG. 1 is aluminum oxide, $Al_2O_3$, as well as pure aluminum. The preferred evaporation rate for the aluminum at this point is around 1000° Å per minute, which continues until a thickness of between 100° Å to 1000° Å or aluminum-oxide-rich aluminum is formed. A thickness of around 500° Å for layer 30 has been found to be advantageous in minimizing series resistance. A slower evaporation rate increases the $Al_2O_3$ content.

The chamber is then re-evacuated and the evaporation of around 10,000° Å of aluminum as the interconnection metallurgy is deposited, as illustrated in step 56 in FIG. 3 and by numeral 32 in FIG. 1. Aluminum 32 is advantageously deposited to a thickness of 8,500° to 10,000° Å. Aluminum doped with a small amount of copper is preferable to pure aluminum. We use the term "aluminum" or "pure aluminum" to also include both copper-doped aluminum as well as copper-doped aluminum-silicon. Other aluminum alloys or aluminum transition metal compounds are also feasible.

An annealing step at around 400° C. for one hour then follows for "leveling", i.e., tightening the statistical distribution of the barrier height values of the Schottky barrier diodes.

This completes our basic process and leaves both high-barrier-height and low-barrier-height SBD's. As previously noted, the anode and cathode of the high-barrier-height SBD are identified by the numerals 41 and 42, respectively, in FIG. 1. The anode and cathode of the low-barrier-height SBD are identified by the numerals 43 and 44, respectively.

We have fashioned three different types of contacts using the same metallurgy. The cathodes of both diodes are ohmic contacts to N+ regions 5 and 7 in layer 3. Clearly, the same metallurgical system may form ohmic contacts to other active regions of the semiconductor as, for example, to the emitters and bases of transistors. The anode 41 of the high-barrier-height SBD uses the aluminum-oxide-rich aluminum between the platinum silicide 15 and aluminum 32 to act as a diffusion barrier, with the platinum silicide yielding an increased barrier height as compared to anode 43 of the low-barrier-height SBD, where no platinum silicide is present. In region 43 transition metal 28 itself contacts the N-silicon substrate 3 directly.

In practice, the transition metal 30 is not necessary for forming the high-barrier-height SBD. However, it is more practical in a manufacturing environment to deposit the transition metal in blanket fashion within all contact openings.

The alternate embodiment of our invention wherein a layer of tantalum having a high tantalum oxide content is disposed between tantalum layer 28 and the intermediate layer 30 is also illustrated in FIG. 3. The step is shown in the flow diagram as step 53 and is illustrated by dashed lines between steps 52 and 54. The only difference between the alternate process and the preferred process is that the bleeding of the water, air or oxygen into the evaporation apparatus is done after the pure tantalum or other transition metal has been deposited and prior to the substitution of the tantalum with the aluminum in the apparatus. As shown in FIG. 3 it is preferable to have 200 Å or less of the tantalum oxide rich tantalum and around 500 Å of the aluminum-oxide-rich aluminum in combination as the interface layers between the pure tantalum and the pure aluminum.

The advantage of providing the second intermediate layer of tantalum-oxide-rich tantalum is in doubly insuring that no free aluminum comes in contact with the pure tantalum. As has been previously discussed, because aluminum tends to react with tantalum and silicon to raise the barrier height of the Schottky barrier diode. More significantly, in the manufacturing environment it is difficult to prevent some oxidation of the tantalum when the intermediate layer of aluminum-oxide-rich aluminum is deposited in step 54. As is known in the art, it is very difficult to prevent the oxidation of a tantalum film during its evaporation. In general, the formation of tantalum oxide is undesirable. We have found that the oxygen in the tantalum oxide is mobile at elevated temperatures, i.e., at around 400° C. and above. The possible effect of this is the alteration of the barrier height or ideality factor of the Schottky barrier diode.

It is not necessary that the aluminum-oxide-rich aluminum layer 30 be disposed in direct contact with the aluminum layer 32 to achieve the beneficial effects of our invention. For example, layer 30 could be sandwiched between two layers of a transition metal by depositing a second layer of the transition metal upon layer 30 prior to depositing aluminum layer 32 (FIG. 1). This more complicated process would still prevent the reaction of aluminum 32 with tantalum layer 30 or silicon substrate 3 as the preferred embodiment does; in addition, the second layer of tantalum would react with a portion of aluminum layer 32 during the aforementioned annealing step to improve its electromigration behavior.

We have estimated, with Auger Spectroscopy Analysis, that the amount of aluminum oxide in the aluminum-oxide-rich aluminum is less than 10%. The amount of tantalum oxide in the tantalum-oxide-rich tantalum layer is less than 40%. An analysis of aluminum-oxide-rich aluminum layers has been discussed in the article by Pettit and Silcox entitled "Oxide Structure in Evaporated Aluminum Film", Journal of Applied Physics, volume 45, No. 7, July 1974, pages 2858–2866.

As an example of the results of our novel process and structure shown in FIGS. 1 and 3, we have achieved a low-barrier-height Schottky barrier diode having a barrier height of 0.47 electron volts. The barrier height remains stable even when the diode is annealed at a temperature of up to 500° C. for one hour. This temperature-time factor far exceeds what could be expected in an operating environment and has been shown to be an accurate test of long-term stability of semiconductors. The ideality factor, $\eta$, is initially 1.0 as deposited and rises to 1.1 after the heat treatment; this ideality factor is quite acceptable for Schottky barrier diodes. This example has been included merely to aid in the understanding of the invention and variations may be made by those of skill in the art without departing from the spirit and scope of the invention.

As an alternative to the preferred method of evaporating the metallurgical system previously described, radio frequency (RF) sputtering could also be used. A typical sputtering tool is the multi-target sputtering tool, model 822, sold by Materials Research Corporation. A leak valve may be incorporated for introducing water, air or oxygen into the sputtering chamber. The sputtering of the transition metal and the aluminum can be done without breaking the vacuum, i.e., in situ, in the sputtering chamber. The air, oxygen or water is introduced during the formation of the aluminum-oxide-rich aluminum layer.

There are other variations for forming the metallurgical system using sputtering equipment. For example, the aluminum-oxide-rich aluminum layer could be formed by reactively sputtering aluminum in an argon-oxygen gas mixture within the sputtering chamber to control the content of aluminum and aluminum oxide in the intermediate layer which acts as a diffusion barrier. A similar process can be used to form the transition-metal-oxide-rich/transition-metal intermediate layer.

As previously discussed our discovery is useful in any instance where aluminum interaction or diffusion occurs with another material. The aluminum-oxide-rich aluminum prevents such diffusion. For example, in field effect transistors or charge-coupled devices polycrystalline silicon is commonly used as the gate electrode and aluminum disposed thereon as the interconnection metallurgy. During the deposition of the aluminum, it tends to diffuse through the silicon gate electrode. Reference is made to the publication by K. Nakamura entitled "Interaction of Al Layers with Polycrystalline Si", Journal of Applied Physics, volume 46, no. 11, November, 1975.

The aluminum-oxide-rich aluminum layer also prevents the diffusion of aluminum into monocrystalline and amorphous silicon. It also prevents the interaction of metals such as gold and silver and rare earth metals such as Gd, Lu, Y, Yb, Pr etc. As previously discussed, the interaction of aluminum with metals is a particular problem at above 350° C. because aluminum is a fast diffusion species at these temperatures.

Our invention can also be used to reduce or prevent the formation of aluminum-lead or aluminum tin eutectics which form preferentially in the aluminum grain boundaries at between 200°–300° C.

While the invention can also be used to reduce or prevent the formation of aluminum-lead or aluminum tin eutectics which form preferentially in the aluminum grain boundaries at between 200°–300° C.

While the invention has been described with reference to preferred embodiments thereof, it will be understood by those skilled in the art that the foregoing and other changes in form and detail may be made therein without departing from the spirit and scope of the invention.

For example, although the invention has been described with particular reference to an integrated circuit structure wherein ohmic contacts and high-and low-barrier Schottky barrier contacts are made, it is not necessary to fabricate all such contacts to come within the purview of our invention.

We claim:
1. A thin film structure comprising:
   a layer of aluminum,
   a layer of material having a tendency to interact with said aluminum; and
   an intermediate layer of aluminum having an aluminum oxide content sufficient to provide an effective barrier to the diffusion of said layer of aluminum into said layer of material disposed between said layer of material and said layer of aluminum.
2. A thin film structure as in claim 1 wherein said material is selected from the group consisting of metals, metal silicides and silicon.
3. A semiconductor contact comprising:
   a silicon semiconductor substrate;
   a layer of a transition metal disposed atop said substrate;
   an upper layer of aluminum;

an intermediate layer of aluminum having an aluminum oxide content sufficient to provide an effective barrier to the diffusion of aluminum into said transition metal layer disposed between said transition metal layer and said upper layer of aluminum.

4. A semiconductor contact as in claim 3 wherein said substrate exhibits N-type conductivity, thereby forming a Schottky barrier diode.

5. A semiconductor contact as in claim 3 wherein said substrate exhibits N+ conductivity and further comprising:
   a layer of metal silicide disposed between said transition metal layer and said substrate, thereby forming an ohmic contact.

6. A semiconductor contact as in claim 3 wherein said transition metal layer is around 1000 Å thick and said intermediate layer is less than around 1000 Å thick.

7. A semiconductor contact as in claim 3 wherein said upper layer of aluminum is in direct contact with said intermediate layer of aluminum having said aluminum oxide content.

8. A semiconductor contact as in claim 7 and further comprising:
   an intermediate layer of a transition metal having a high transition metal oxide content disposed between said transition metal and said intermediate layer of aluminum having an aluminum oxide content.

9. A semiconductor contact as in claim 3 wherein said transition metal is selected from the group consisting of tantalum, zirconium, hafnium, titanium and nickel.

10. A Schottky barrier diode which exhibits a barrier height of around 0.5 electron volts comprising:
    a silicon semiconductor substrate having an N type impurity concentration of from $1 \times 10^{16}$ to $8 \times 10^{16}$ atoms per $cm^3$;
    a layer of tantalum disposed atop said substrate;
    an upper layer of aluminum;
    an intermediate layer of aluminum having an aluminum oxide content sufficient to provide an effective barrier to the diffusion of said layer of aluminum into said layer of tantalum disposed between said tantalum layer and said upper layer of aluminum.

11. In an integrated circuit structure having ohmic and high-barrier-height Schottky barrier diode contacts which include metal silicide layers overlying N+ type silicon regions and first N− type silicon regions, respectively, and having low-barrier-height Schottky barrier diode contacts overlying second N− type silicon regions, and further including a transition metal layer disposed atop each of said metal silicide layers and said second N− type silicon regions, and aluminum layer disposed above each of said transition metal layers,
    the improvement wherein each of said contacts further comprise:
    an intermediate layer of aluminum having an aluminum oxide content sufficient to provide an effective barrier to the diffusion of said layer of aluminum into said transition metal layers disposed between each of said transition metal and said aluminum layers.

12. A semiconductor contact as in claim 11 and further comprising:
    an intermediate layer of said transition metal having a high transition metal oxide content disposed between said transition metal layers and said intermediate layers of aluminum having an aluminum oxide content.

13. A semiconductor contact as in claim 11 wherein said transition metal is selected from the group consisting of tantalum, zirconium, hafnium, titanium and nickel.

* * * * *